(12) United States Patent
Sano

(10) Patent No.: US 11,956,893 B2
(45) Date of Patent: Apr. 9, 2024

(54) FLEXIBLE SUBSTRATE

(71) Applicant: Japan Display Inc., Tokyo (JP)

(72) Inventor: Takumi Sano, Tokyo (JP)

(73) Assignee: Japan Display Inc., Tokyo (JP)

( * ) Notice: Subject to any disclaimer, the term of this patent is extended or adjusted under 35 U.S.C. 154(b) by 362 days.

(21) Appl. No.: 17/450,857

(22) Filed: Oct. 14, 2021

(65) Prior Publication Data

US 2022/0039248 A1 Feb. 3, 2022

Related U.S. Application Data

(63) Continuation of application No. PCT/JP2020/011778, filed on Mar. 17, 2020.

(30) Foreign Application Priority Data

Apr. 26, 2019 (JP) .................................. 2019-086164

(51) Int. Cl.
*H05K 1/02* (2006.01)
*H05K 1/18* (2006.01)

(52) U.S. Cl.
CPC ........... *H05K 1/028* (2013.01); *H05K 1/0283* (2013.01); *H05K 1/189* (2013.01); *H05K 2201/052* (2013.01)

(58) Field of Classification Search
CPC ...... H05K 1/028; H05K 1/0283; H05K 1/189; H05K 2201/052
USPC ...................................................... 361/749
See application file for complete search history.

(56) References Cited

U.S. PATENT DOCUMENTS

| | | | |
|---|---|---|---|
| 2014/0220422 | A1 | 8/2014 | Rogers et al. |
| 2015/0282294 | A1 | 10/2015 | Wakuda et al. |
| 2015/0282296 | A1 | 10/2015 | Ogura et al. |
| 2015/0373831 | A1 | 12/2015 | Jia et al. |
| 2017/0181276 | A1 | 6/2017 | Sawada et al. |
| 2019/0013275 | A1 | 1/2019 | Sunshine et al. |
| 2020/0090688 | A1* | 3/2020 | Tokuda ................. H02K 11/30 |

(Continued)

FOREIGN PATENT DOCUMENTS

| | | |
|---|---|---|
| JP | 2005-116685 A | 4/2005 |
| JP | 2015-198101 A | 11/2015 |
| JP | 2015-198102 A | 11/2015 |

(Continued)

OTHER PUBLICATIONS

International Search Report dated Jun. 9, 2020 in PCT/JP2020/011778 filed on Mar. 17, 2020, 2 pages.

(Continued)

*Primary Examiner* — Andargie M Aychillhum
(74) *Attorney, Agent, or Firm* — Maier & Maier, PLLC

(57) ABSTRACT

According to one embodiment, a flexible substrate includes an insulating base material including an island-shaped portion, a first portion having a band shape and connected to the island-shaped portion, and a second portion having a band shape and connected to the island-shaped portion, and a wiring layer provided on the insulating base material. The first portion includes a first curved portion and a first straight portion connecting the island-shaped portion and the first curved portion, and the second portion includes a second curved portion and a second straight portion connecting the island-shaped portion and the second curved portion.

13 Claims, 8 Drawing Sheets

(56) References Cited

U.S. PATENT DOCUMENTS

2020/0296840 A1* 9/2020 Karavakis .............. H05K 1/115

FOREIGN PATENT DOCUMENTS

| | | |
|---|---|---|
| JP | 2017-113088 A | 6/2017 |
| JP | 2017-118109 A | 6/2017 |
| JP | 2018116959 A | 7/2018 |
| WO | 2017003531 A1 | 1/2017 |

OTHER PUBLICATIONS

Office Action issued on Dec. 20, 2022, in corresponding Japanese Application No. 2019086164, 10 pages.
Office Action dated Apr. 18, 2023, in corresponding Japanese Application No. 2019086164, 10 pages.

* cited by examiner

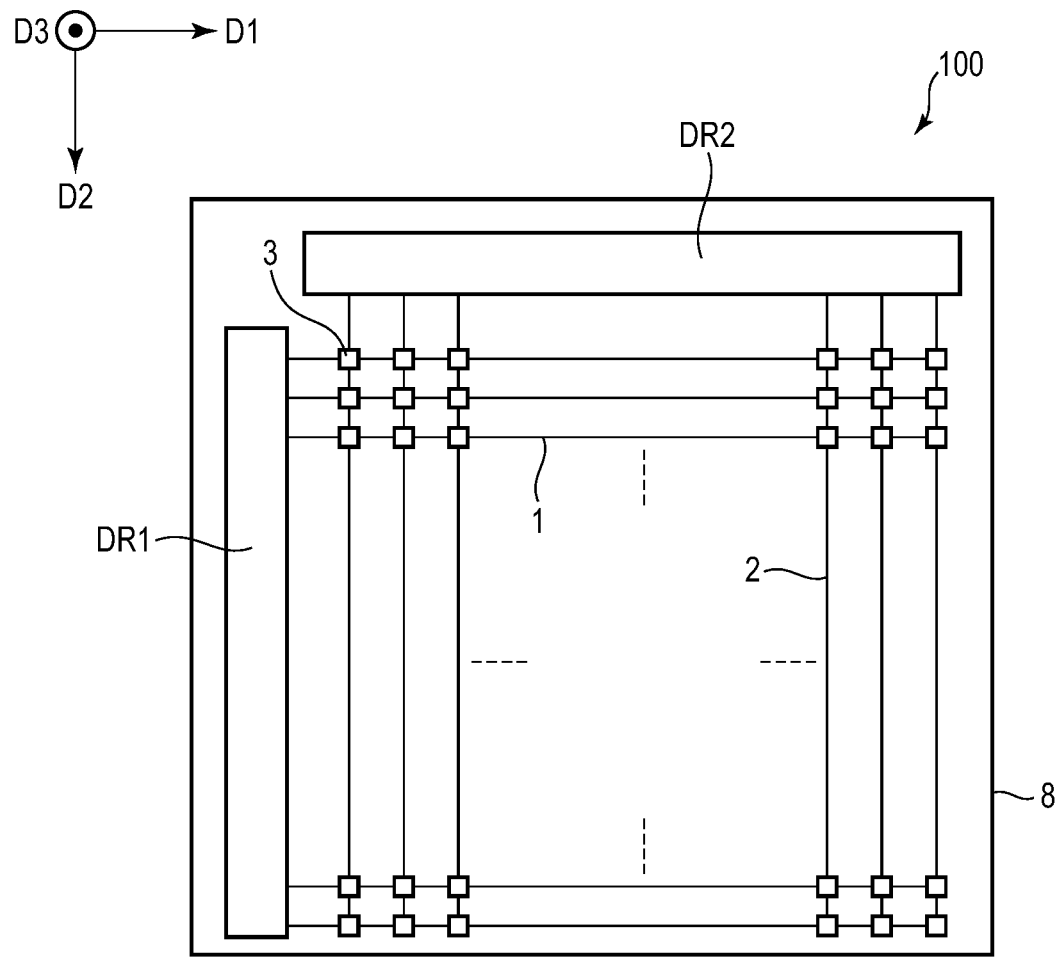
F I G. 1

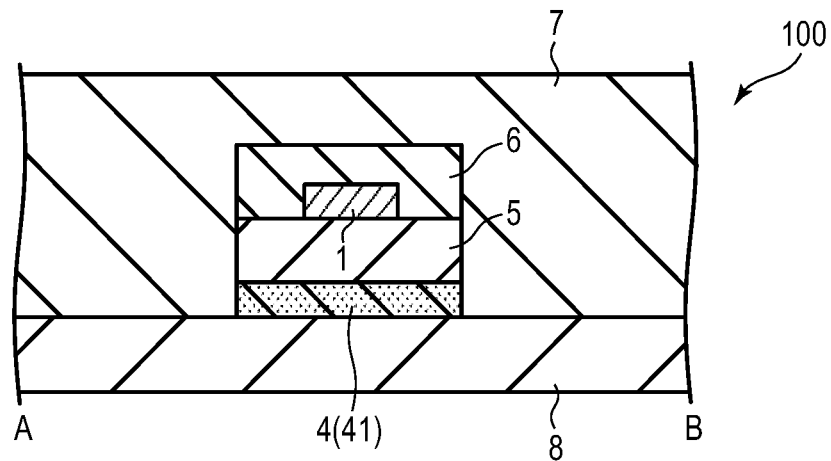
F I G. 3
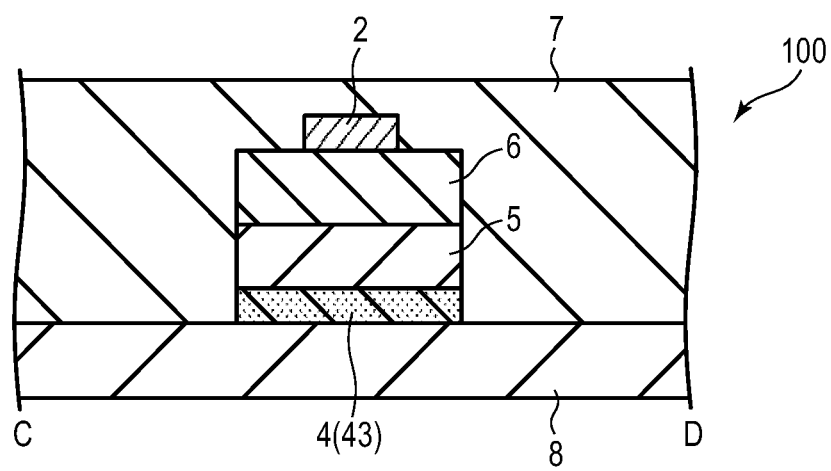
F I G. 4

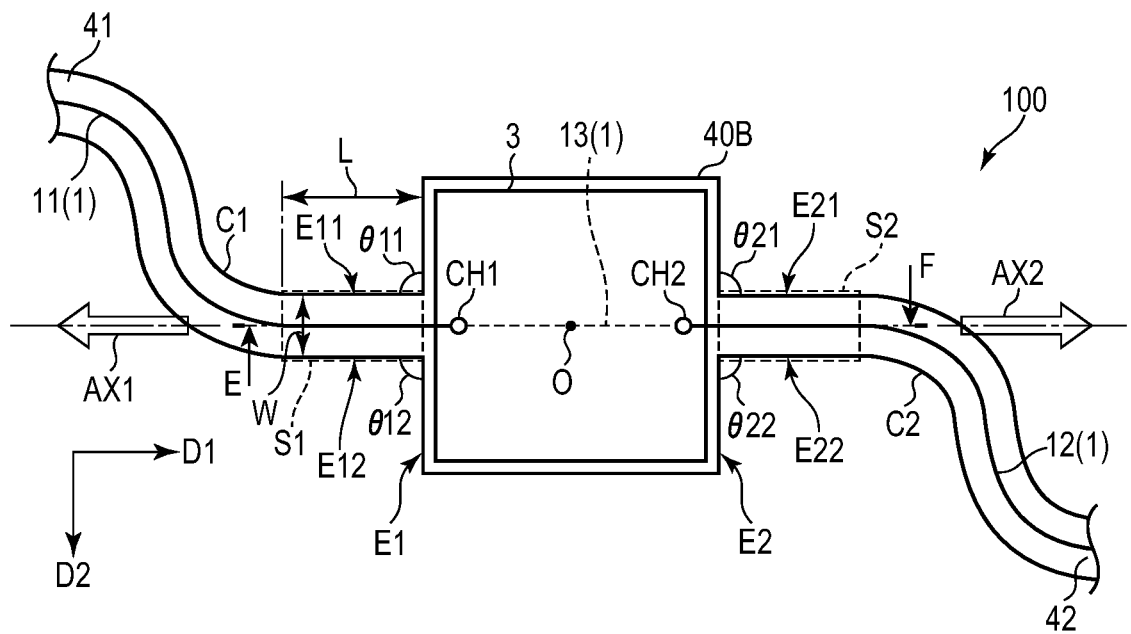
F I G. 5
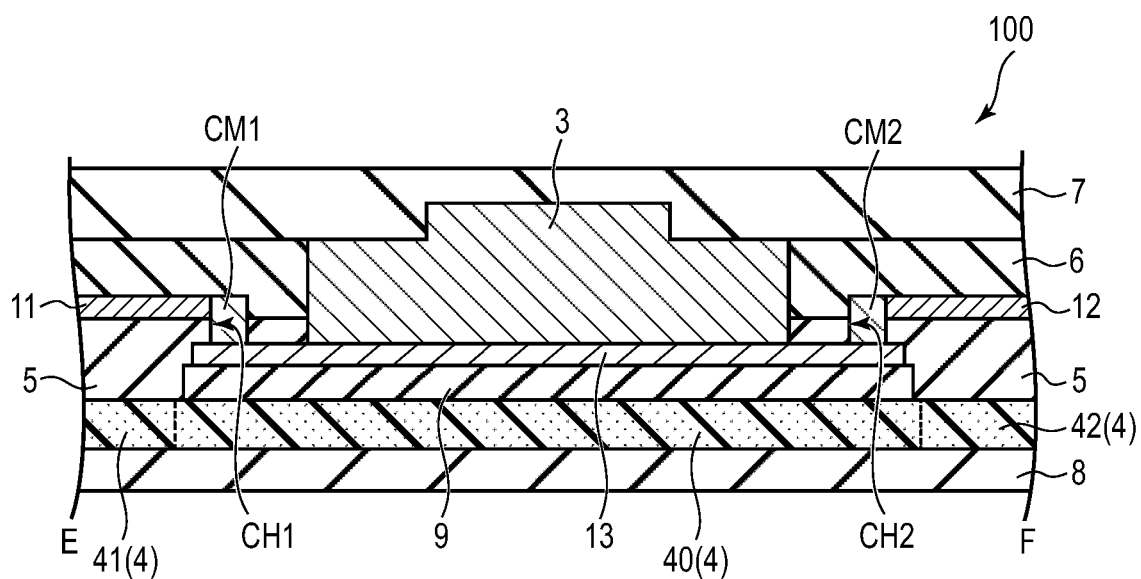
F I G. 6

FLEXIBLE SUBSTRATE

CROSS-REFERENCE TO RELATED APPLICATION

This application is a Continuation Application of PCT Application No. PCT/JP2020/011778, filed Mar. 17, 2020 and based upon and claiming the benefit of priority from Japanese Patent Application No. 2019-086164, filed Apr. 26, 2019, the entire contents of all of which are incorporated herein by reference.

FIELD

Embodiments described herein relate generally to a flexible substrate.

BACKGROUND

In recent years, use of flexible substrates having flexibility and stretchability has been proposed in various fields. As an example, a use form is considered in which a flexible substrate having electrical elements arranged in a matrix is attached to a curved surface of a housing of an electronic device or a human body or the like. As the electrical element, for example, various sensors such as a touch sensor and a temperature sensor, and a display element can be applied.

In the flexible substrate, it is necessary to take countermeasures so that wiring is not damaged by stress due to bending or stretching. As the countermeasures, for example, it has been proposed to provide a honeycomb-shaped opening in a substrate that supports the wiring, or to form the wiring in a serpentine shape (meander shape).

BRIEF DESCRIPTION OF THE DRAWINGS

FIG. 1 is a schematic plan view of a flexible substrate 100 according to the present embodiment.

FIG. 3 is a schematic cross-sectional view of a part of the flexible substrate 100 indicated by A-B in FIG. 2.

FIG. 4 is a schematic cross-sectional view of a part of the flexible substrate 100 indicated by C-D in FIG. 2.

FIG. 5 is an enlarged plan view of an island-shaped portion 40B, a first portion 41, and a second portion 42 in the flexible substrate 100 illustrated in FIG. 2.

FIG. 6 is a cross-sectional view of the flexible substrate 100 taken along line E-F illustrated in FIG. 5.

DETAILED DESCRIPTION

Figure 2:
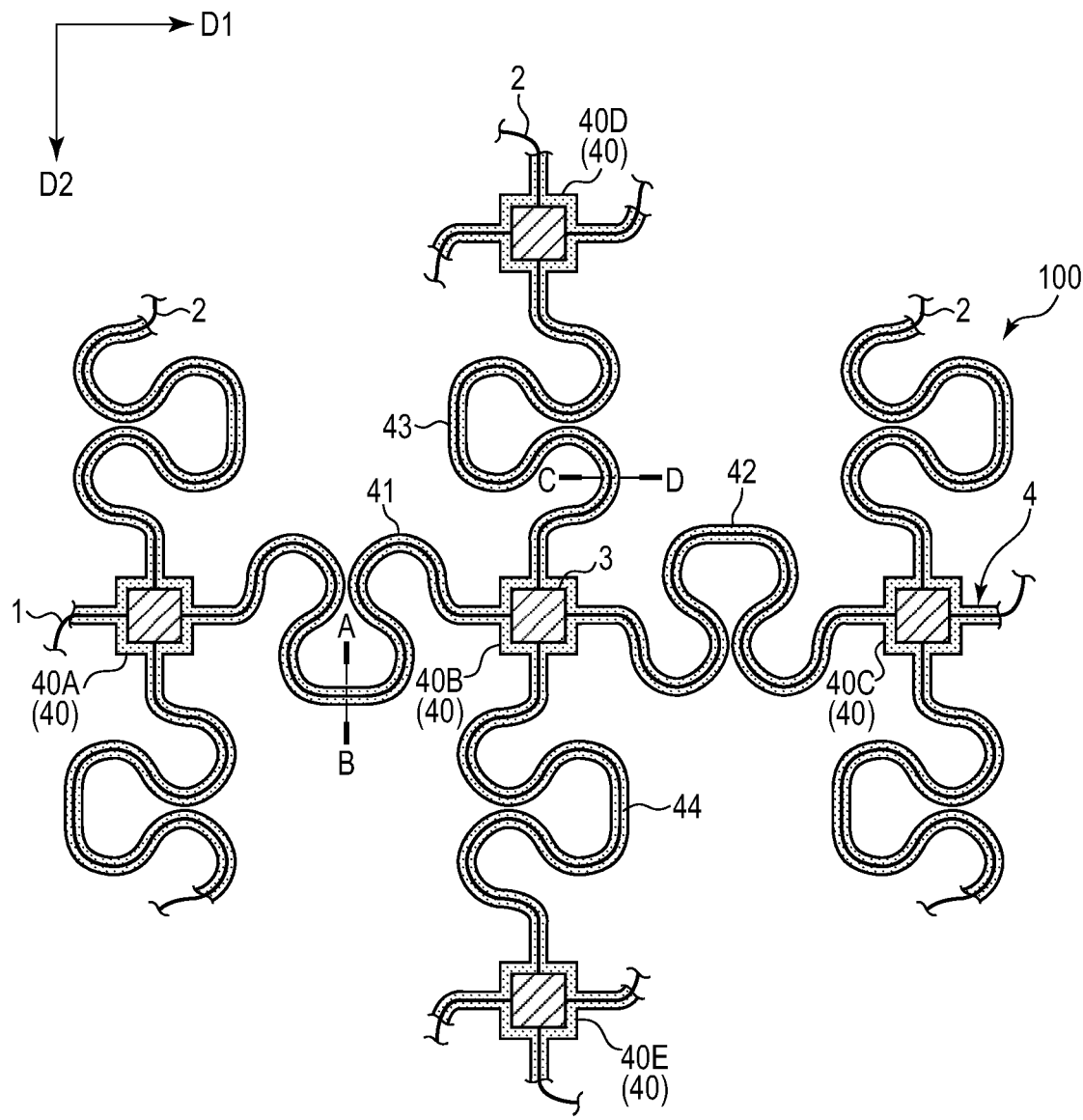
FIG. 2 is an enlarged plan view of a part of the flexible substrate 100 illustrated in FIG. 1.

In general, according to one embodiment, there is provided a flexible substrate comprising an insulating base material comprising an island-shaped portion, a first portion having a band shape and connected to the island-shaped portion, and a second portion having a band shape and connected to the island-shaped portion, and a wiring layer provided on the insulating base material, wherein the first portion comprises a first curved portion and a first straight portion connecting the island-shaped portion and the first curved portion, and the second portion comprises a second curved portion and a second straight portion connecting the island-shaped portion and the second curved portion.

According to another embodiment, there is provided a flexible substrate comprising an insulating base material comprising an island-shaped portion, a first portion having a band shape and connected to the island-shaped portion, and a second portion having a band shape and connected to the island-shaped portion, and a wiring layer provided on the insulating base material, wherein the first portion and the second portion are formed to be stretchable on a same straight line.

According to another embodiment, there is provided a flexible substrate comprising an insulating base material comprising an island-shaped portion, a first portion having a band shape and connected to the island-shaped portion, and a second portion having a band shape and connected to the island-shaped portion, and a wiring layer provided on the insulating base material, wherein the first portion has a first side edge and a second side edge opposite to the first side edge, the second portion has a third side edge and a fourth side edge opposite to the third side edge, an angle formed by the island-shaped portion and the first side edge is substantially equal to an angle formed by the island-shaped portion and the second side edge, and an angle formed by the island-shaped portion and the third side edge is substantially equal to an angle formed by the island-shaped portion and the fourth side edge.

Embodiments will be described hereinafter with reference to the accompanying drawings. The disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same elements as those described in connection with preceding drawings are denoted by like reference numerals, and a detailed description thereof is omitted unless otherwise necessary.

FIG. 1 is a schematic plan view of a flexible substrate 100 according to the present embodiment. In the present embodiment, as illustrated, a first direction D1, a second direction D2, and a third direction D3 are defined. The first direction D1 and the second direction D2 are parallel to the main surface of the flexible substrate 100 and intersect each other. The third direction D3 is a direction perpendicular to the first direction D1 and the second direction D2, and corresponds to the thickness direction of the flexible substrate 100. The first direction D1 and the second direction D2 intersect perpendicularly in the present embodiment, but may intersect at an angle other than perpendicular.

The flexible substrate 100 includes a plurality of scanning lines 1, a plurality of signal lines 2, a plurality of electrical elements 3, a support 8, a scanning line driver DR1, and a signal line driver DR2. The scanning line driver DR1 and the signal line driver DR2 may be provided outside the flexible substrate 100. The scanning line 1, the signal line 2, and the electrical element 3 are provided on the support 8. The plurality of scanning lines 1 entirely extend in the first direction D1 and are arranged in the second direction D2. Each of the plurality of scanning lines 1 is electrically connected to the scanning line driver DR1. The plurality of signal lines 2 entirely extend in the second direction D2 and are arranged in the first direction D1. Each of the plurality of signal lines 2 is electrically connected to the signal line driver DR2. Each of the electrical elements 3 is provided at an intersection between the scanning line 1 and the signal line 2, and is electrically connected to the scanning line 1 and the signal line 2.

The scanning line 1 and the signal line 2 are an example of a wiring layer included in the flexible substrate 100. The scanning line 1 and the signal line 2 can be formed of, for example, a metal material or a transparent conductive material, and may have a single-layer structure or a laminated structure. The flexible substrate 100 may include, in addition to the scanning line 1 and the signal line 2, another type of wiring such as a power supply line that supplies power to the electrical element 3.

The electrical element 3 is, for example, a sensor, a semiconductor element, an actuator, or the like. For example, an optical sensor that receives visible light or near-infrared light, a temperature sensor, a pressure sensor, a touch sensor, or the like can be applied as the sensor. For example, a light emitting element, a light receiving element, a diode, a transistor, or the like can be applied as the semiconductor element. In a case where the electrical element 3 is a light emitting element, a flexible display having flexibility and stretchability can be realized. As the light emitting element, for example, a light emitting diode having a size of about 100 µm such as a mini LED or a micro LED, an organic electroluminescent element, or the like can be applied. In a case where the electrical element 3 is an actuator, for example, a piezoelectric element or the like can be applied. The electrical element 3 is not limited to the one exemplified here, and other elements having various functions can be applied. In addition, the electrical element 3 may be a capacitor, a resistor, or the like.

The scanning line 1 supplies a scanning signal to the electrical element 3. For example, in a case where the electrical element 3 is accompanied by output of a signal such as a sensor, an output signal from the electrical element 3 is supplied to the signal line 2. In addition, for example, in a case where the electrical element 3 operates in response to an input signal such as a light emitting element or an actuator, a drive signal is supplied to the signal line 2.

In the example illustrated in FIG. 1, the scanning line driver DR1 functions as a signal supply source that supplies a scanning signal to each of the scanning lines 1. In addition, the signal line driver DR2 functions as a signal supply source that supplies a drive signal to each of the signal lines 2 or a signal processing unit that processes an output signal output to each of the signal lines 2.

FIG. 2 is an enlarged plan view of a part of the flexible substrate 100 illustrated in FIG. 1. The flexible substrate 100 further includes an insulating base material 4 that is an insulating substrate and supports the scanning lines 1 and the signal lines 2. The insulating base material 4 has stretchability and flexibility. The insulating base material 4 can be formed of, for example, polyimide, but is not limited to this example.

The insulating base material 4 includes an island-shaped portion 40, and a first portion 41, a second portion 42, a third portion 43, and a fourth portion 44 each having a band shape, which are connected to the island-shaped portion 40. The plurality of island-shaped portions 40 are arranged in the first direction D1 and the second direction D2 at intervals to each other. The first portion 41 and the second portion 42 connect the plurality of island-shaped portions 40 arranged in the first direction D1. The third portion 43 and the fourth portion 44 connect the plurality of island-shaped portions 40 arranged in the second direction D2.

In FIG. 2, the plurality of island-shaped portions 40 include island-shaped portions 40A, 40B, 40C, 40D, and 40E. The island-shaped portions 40A, 40B, and 40C are arranged in this order in the first direction D1. Focusing on the island-shaped portion 40B, the first portion 41 connects the island-shaped portions 40A and 40B, and the second portion 42 connects the island-shaped portions 40B and 40C. The island-shaped portions 40D, 40B, and 40E are arranged in this order in the second direction D2. Focusing on the island-shaped portion 40B, the third portion 43 connects the island-shaped portions 40D and 40B, and the fourth portion 44 connects the island-shaped portions 40B and 40E.

The first portion 41 and the second portion 42 are formed to be stretchable along the first direction D1, and overlap the scanning line 1. The third portion 43 and the fourth portion 44 are formed to be stretchable along the second direction D2 and overlap the signal line 2. Each of the first to fourth portions 41 to 44 is formed in a wave shape and includes at least one curved portion. In other words, the first to fourth portions 41 to 44 are formed in a serpentine shape (meander shape). In the example illustrated in FIG. 2, each of the first to fourth portions 41 to 44 includes a straight portion. Although details will be described later, the straight portion connects the island-shaped portion 40 and the curved portion.

Each of the island-shaped portions 40 is formed in, for example, a quadrangular shape in plan view. The electrical element 3 is provided in the island-shaped portion 40. The island-shaped portion 40 may be formed in another polygonal shape, or may be formed in a circular shape or an elliptical shape.

The scanning line 1 and the signal line 2 correspond to a wiring layer provided on the insulating base material 4. The scanning line 1 and the signal line 2 are provided in different layers, which will be described later. The scanning line 1 and the signal line 2 intersect at the island-shaped portion 40. The scanning line 1 is provided over the first portion 41 and the second portion 42, and is formed in the same shape as the first portion 41 and the second portion 42. The signal line 2 is provided over the third portion 43 and the fourth portion 44, and is formed in the same shape as the third portion 43 and the fourth portion 44. That is, both the scanning line 1 and the signal line 2 are formed in a serpentine shape.

FIG. 3 is a schematic cross-sectional view of a part of the flexible substrate 100 indicated by A-B in FIG. 2. The flexible substrate 100 further includes a first organic insulating layer 5, a second organic insulating layer 6, and a coating layer 7 in addition to the above-described elements. The first organic insulating layer 5 and the second organic insulating layer 6 are formed of, for example, an organic material such as polyimide. The coating layer 7 is formed of a flexible organic material such as parylene (polyparaxylylene).

The first organic insulating layer 5 covers the upper surface of the insulating base material 4. The scanning line 1 is disposed on the first organic insulating layer 5. The second organic insulating layer 6 covers the scanning line 1 and the first organic insulating layer 5. In the example illustrated in FIG. 3, no signal line is disposed immediately above the first portion 41. The coating layer 7 covers the insulating base material 4, the first organic insulating layer 5, and the second organic insulating layer 6. The support 8 is formed of a flexible organic material. The support 8 covers the lower surface of the insulating base material 4. In a region where the insulating base material 4 is not provided, the coating layer 7 and the support 8 are in contact with each other. The support 8 may be formed by applying an organic material to the lower surfaces of the insulating base material 4 and the coating layer 7, or may be formed in a film shape or a plate shape and then attached with an adhesive layer interposed therebetween.

The first organic insulating layer 5 and the second organic insulating layer 6 may also be provided in a region where the insulating base material 4 is not provided. However, from the viewpoint of flexibility and stretchability of the flexible substrate 100, a disposed form as illustrated in FIG. 3 is preferable.

FIG. 4 is a schematic cross-sectional view of a part of the flexible substrate 100 indicated by C-D in FIG. 2. The signal line 2 is disposed on the second organic insulating layer 6. The coating layer 7 covers the signal line 2, the insulating base material 4, the first organic insulating layer 5, and the second organic insulating layer 6. In the example illustrated in FIG. 4, no scanning line is disposed immediately above the third portion 43.

FIG. 5 is an enlarged plan view of the island-shaped portion 40B, the first portion 41, and the second portion 42 in the flexible substrate 100 illustrated in FIG. 2. Here, illustration of the third portion 43 and the fourth portion 44 is omitted.

The first portion 41 includes a first curved portion C1 and a first straight portion S1. The first straight portion S1 connects the island-shaped portion 40B and the first curved portion C1. The second portion 42 includes a second curved portion C2 and a second straight portion S2. The second straight portion S2 connects the island-shaped portion 40B and the second curved portion C2. In the example shown in FIG. 5, the island-shaped portion 40B is formed in a substantially quadrangular shape in plan view, and has a pair of sides E1 and E2 facing each other in the first direction D1. The first straight portion S1 is connected to the side E1, and the second straight portion S2 is connected to the side E2. The first straight portion S1 and the second straight portion S2 are substantially parallel, and linearly extend along the first direction D1, for example. In the example shown in FIG. 5, the connection position between the first straight portion S1 and the island-shaped portion 40B is provided at a position facing the connection position between the second straight portion S2 and the island-shaped portion 40B with the island-shaped portion 40B as a center. The first straight portion S1 and the second straight portion S2 extend on the same straight line parallel to the first direction D1. When an intersection of diagonal lines in the island-shaped portion 40B having a quadrangular shape or a geometric center of the island-shaped portion 40B is a center O of the island-shaped portion 40B, the first portion 41 and the second portion 42 are in a point-symmetric relationship with respect to the center O.

Focusing on the first straight portion S1, a length L along the first direction D1 is equal to or larger than a width W along the second direction D2 (L≥W). Further, the length L is desirably one time or more of the width W. The relationship between the length and the width of the second straight portion S2 is the same as that of the first straight portion S1, and the length is equal to or larger than the width.

The first straight portion S1 extends substantially perpendicularly to the side E1. More specifically, the first straight portion S1 has a first side edge E11 and a second side edge E12 opposite to the first side edge E11. An angle $\theta 11$ formed by the side E1 of the island-shaped portion 40B and the first side edge E11 is substantially equal to an angle $\theta 12$ formed by the side E1 and the second side edge E12. For example, the angles $\theta 11$ and $\theta 12$ are about 90°. The second straight portion S2 extends substantially perpendicularly to the side E2. More specifically, the second straight portion S2 has a third side edge E21 and a fourth side edge E22 opposite to the third side edge E21. An angle $\theta 21$ formed by the side E2 of the island-shaped portion 40B and the third side edge E21 is substantially equal to an angle $\theta 22$ formed by the side E2 and the fourth side edge E22. For example, the angles $\theta 21$ and $\theta 22$ are about 90°.

Next, description will be focused on the scanning line 1. The scanning line 1 includes a first wiring portion 11 provided in the first portion 41 and a second wiring portion 12 provided in the second portion 42. The first wiring portion 11 linearly extends along the first direction D1 in the first straight portion S1 and is curved in the first curved portion C1. The second wiring portion 12 linearly extends along the first direction D1 in the second straight portion S2 and is curved in the second curved portion C2. The first wiring portion 11 and the second wiring portion 12 are electrically connected. More specifically, the scanning line 1 further has a third wiring portion 13 indicated by a broken line. The third wiring portion 13 overlaps (intersects) the electrical element 3. The first wiring portion 11 and the second wiring portion 12 are disposed in a layer different from that of the third wiring portion 13. The first wiring portion 11 and the third wiring portion 13 are electrically connected through a contact hole CH1. The second wiring portion 12 and the third wiring portion 13 are electrically connected through a contact hole CH2.

The first portion 41 and the second portion 42 having the above-described configuration are formed to be stretchable along the first direction D1. The first portion 41 extends along an extension axis AX1 when a stretching force is applied in a direction opposite to an arrow indicating the first direction D1. The second portion 42 extends along an extension axis AX2 when a stretching force is applied in the direction of the arrow indicating the first direction D1. In the example shown in FIG. 5, since the first straight portion S1 and the second straight portion S2 are substantially parallel and extend on the same straight line, the extension axes AX1 and AX2 are located on the same straight line. That is, the first portion 41 and the second portion 42 are stretchable on the same straight line.

In a case where neither the extension axes AX1 nor AX2 is located on the same straight line, when the first portion 41 and the second portion 42 extend, rotational torque is generated in which the island-shaped portion 40B tends to rotate in a plane defined by the first direction D1 and the second direction D2. Therefore, stress associated with the rotational torque is generated in the connection portion between the island-shaped portion 40B and the first portion 41 and the connection portion between the island-shaped portion 40B and the second portion 42.

In the present embodiment, as described above, since the extension axes AX1 and AX2 are located on the same straight line, when the first portion 41 and the second portion 42 extend, the rotational torque of the island-shaped portion 40B can be suppressed.

In addition, in the example illustrated in FIG. 5, the angle $\theta 11$ is substantially equal to the angle $\theta 12$, and the angle $\theta 21$ is substantially equal to the angle $\theta 22$. Therefore, as compared with the case where the angle $\theta 11$ is different from the angle $\theta 12$ and the angle $\theta 21$ is different from the angle $\theta 22$, it is possible to suppress the rotational torque of the island-shaped portion 40B generated when the first portion 41 and the second portion 42 extend.

As a result, in the first curved portion C1 and the second curved portion C2, the stress caused by the rotational torque is suppressed, which can suppress occurrence of cracks. In addition, the stress transmitted to the scanning line 1 provided in the first portion 41 including the first curved portion C1 and the second portion 42 including the second curved portion C2 is suppressed, which can suppress disconnection of the scanning line 1.

The third portion 43 and the fourth portion 44, which are not illustrated, are configured similarly to the first portion 41 and the second portion 42. Therefore, the occurrence of cracks in the third portion 43 and the fourth portion 44 can be suppressed, and the disconnection of the signal lines 2 provided in the third portion 43 and the fourth portion 44 can be suppressed.

According to the study of the inventors, in the configuration example in which the island-shaped portion 40 is formed in a square shape, the length of one side of the island-shaped portion 40 is 90 µm, and the island-shaped portions 40 are disposed at a pitch of 470 µm, a strain amount has been compared between a case where the first straight portion S1 and the second straight portion S2 are provided (Example) and a case where the first straight portion S1 and the second straight portion S2 are not provided (Comparative Example). In the Example, the length L of each of the first straight portion S1 and the second straight portion S2 was set to 40 µm, and the width W of each of the first straight portion S1 and the second straight portion S2 was set to 30 µm.

In the Example and Comparative Example, the strain amount of the first curved portion C1 and that of the second curved portion C2 when the amount of extension along the extension axis was 50% were compared, and it was then confirmed that the strain amount in the Example was reduced by 30% as compared with the strain amount in the Comparative Example.

FIG. 6 is a cross-sectional view of the flexible substrate 100 taken along line E-F illustrated in FIG. 5. The electrical element 3 is disposed on the island-shaped portion 40 of the insulating base material 4. An inorganic insulating layer 9 (passivation layer) is disposed between the electrical element 3 and the island-shaped portion 40. The inorganic insulating layer 9 is formed in an island shape overlapping the electrical element 3 (or the island-shaped portion 40) in plan view. The first wiring portion 11 and the second wiring portion 12 are disposed on the first organic insulating layer 5 and covered with the second organic insulating layer 6. The third wiring portion 13 is disposed on the inorganic insulating layer 9 and is electrically connected to the electrical element 3. In the example illustrated in FIG. 6, both ends of the third wiring portion 13 are covered with the first organic insulating layer 5.

The contact holes CH1 and CH2 are provided in the first organic insulating layer 5. The first wiring portion 11 is electrically connected to the third wiring portion 13 via a connection member CM1 disposed in the contact hole CH1. The second wiring portion 12 is electrically connected to the third wiring portion 13 via a connection member CM2 disposed in the contact hole CH2. The connection member CM1 may be a part of the first wiring portion 11, or may be provided separately from the first wiring portion 11. The connection member CM2 may be a part of the second wiring portion 12 or may be provided separately from the second wiring portion 12.

As described above, the island-shaped inorganic insulating layer 9 is disposed between the electrical element 3 and the insulating base material 4. The inorganic insulating layer 9 functions as a protective film for suppressing entry of moisture or the like into the electrical element 3 or the third wiring portion 13 of the scanning line 1. Therefore, the reliability of the flexible substrate 100 is improved. In general, inorganic films are more likely to be cracked than organic films, but since the inorganic insulating layer 9 is not provided below the first wiring portion 11 and the second wiring portion 12 of the scanning line 1, disconnection in the first wiring portion 11 and the second wiring portion 12 is suppressed. The same applies to a signal line (not illustrated). Furthermore, as compared with a case where the inorganic insulating layer 9 is provided on the entire flexible substrate 100, the stretchability and flexibility of the flexible substrate 100 are less likely to be inhibited.

In addition, in the scanning line 1, since the third wiring portion 13 overlapping the electrical element 3 is disposed in a layer different from that of the first wiring portion 11 and the second wiring portion 12, a degree of freedom in design in the vicinity of the electrical element 3 is improved. In addition, since the contact holes CH1 and CH2 are provided above the inorganic insulating layer 9, a connection failure at a connection position between the first wiring portion 11 and the third wiring portion 13 and a connection position between the second wiring portion 12 and the third wiring portion 13 is suppressed.

The island-shaped portion 40 of the insulating base material 4 is disposed below the electrical element 3. Accordingly, electrical element 3 can be favorably supported. Further, the insulating base material 4 is supported by the support 8. Therefore, the strength of the flexible substrate 100 is increased as a whole, and entry of moisture or the like from below is suppressed.

Next, other configuration examples will be described. In each of the following configuration examples, description will be given focusing on the shape of the insulating base material 4, and only the insulating base material 4 is illustrated in the drawings illustrating the configuration examples.

Figure 7:
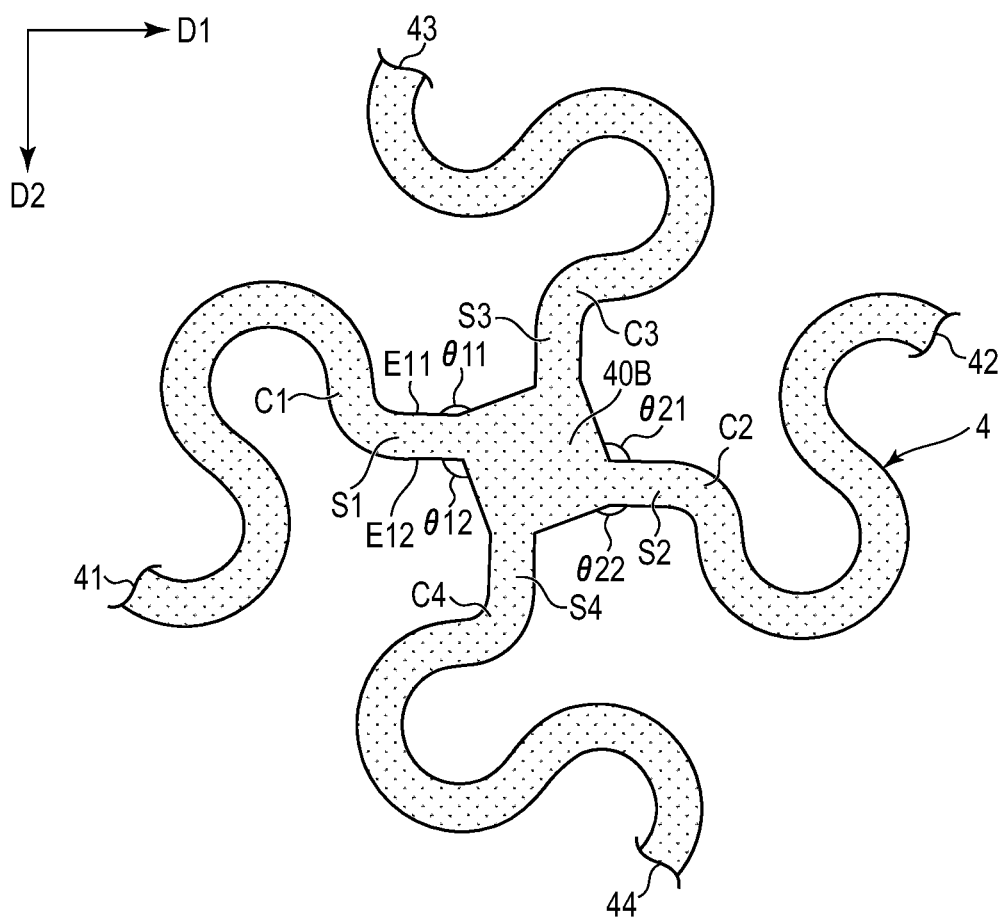
FIG. 7 is a plan view illustrating another configuration example.

FIG. 7 is a plan view illustrating another configuration example. The configuration example illustrated in FIG. 7 is different from the configuration example illustrated in FIG. 2 in that the first straight portion S1 of the first portion 41 and the second straight portion S2 of the second portion 42 are connected to the vicinity of opposing corner portions of the island-shaped portion 40B. In addition, the first straight portion S1 and the second straight portion S2 are substantially parallel, but do not extend on the same straight line. The angle θ11 formed by the first side edge E11 of the first straight portion S1 and the island-shaped portion 40B is different from the angle θ12 formed by the second side edge E12 and the island-shaped portion 40B. Similarly, the angle θ21 formed by the second straight portion S2 is different from the angle θ22 formed by the second straight portion S2.

Also in such a configuration example, similarly to the above configuration example, in the first portion 41, the first straight portion S1 connects the first curved portion C1 and the island-shaped portion 40B, and in the second portion 42, the second straight portion S2 connects the second curved portion C2 and the island-shaped portion 40B. Therefore, when the first portion 41 and the second portion 42 extend, although rotational torque is generated in the island-shaped portion 40B, concentration of stress in the first curved portion C1 and the second curved portion C2 can be alleviated. Therefore, the occurrence of cracks in the first curved portion C1 and the second curved portion C2 can be suppressed. In addition, disconnection of the scanning line 1 disposed over the first portion 41 and the second portion 42 can be suppressed.

In the third portion 43, the third straight portion S3 connects the third curved portion C3 and the island-shaped portion 40B, and in the fourth portion 44, the fourth straight portion S4 connects the fourth curved portion C4 and the island-shaped portion 40B. Therefore, when the third portion 43 and the fourth portion 44 extend, although rotational torque is generated in the island-shaped portion 40B, concentration of stress in the third curved portion C3 and the fourth curved portion C4 can be alleviated. Therefore, the occurrence of cracks in the third curved portion C3 and the fourth curved portion C4 can be suppressed. In addition, disconnection of the signal line 2 disposed over the third portion 43 and the fourth portion 44 can be suppressed.

Figure 8:
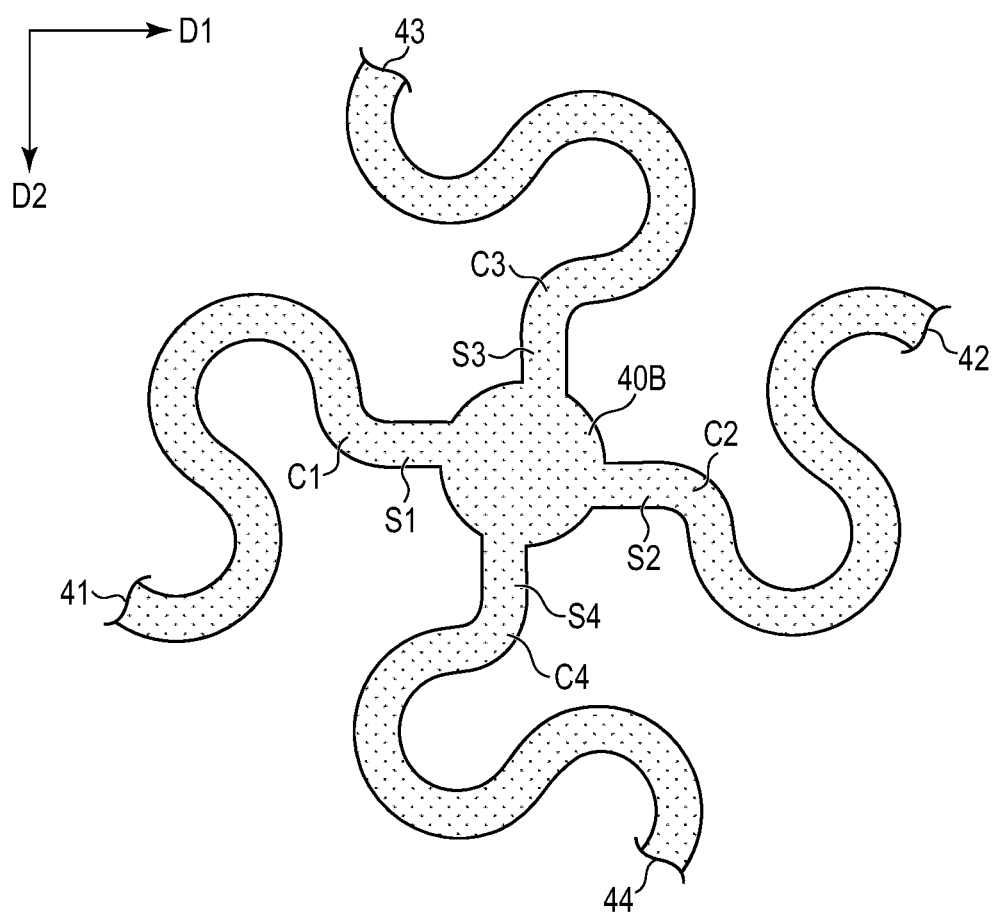
FIG. 8 is a plan view illustrating another configuration example.

FIG. 8 is a plan view illustrating another configuration example. The configuration example illustrated in FIG. 8 is different from the configuration example illustrated in FIG. 7 in that the island-shaped portion 40B is formed in a substantially circular shape in plan view. The configuration is similar to the configuration example illustrated in FIG. 7 in that the first straight portion S1 of the first portion 41, the second straight portion S2 of the second portion 42, the third straight portion S3 of the third portion 43, and the fourth straight portion S4 of the fourth portion 44 are connected to the island-shaped portion 40B. Therefore, the same effects as those of the above configuration example can be obtained.

Figure 9:
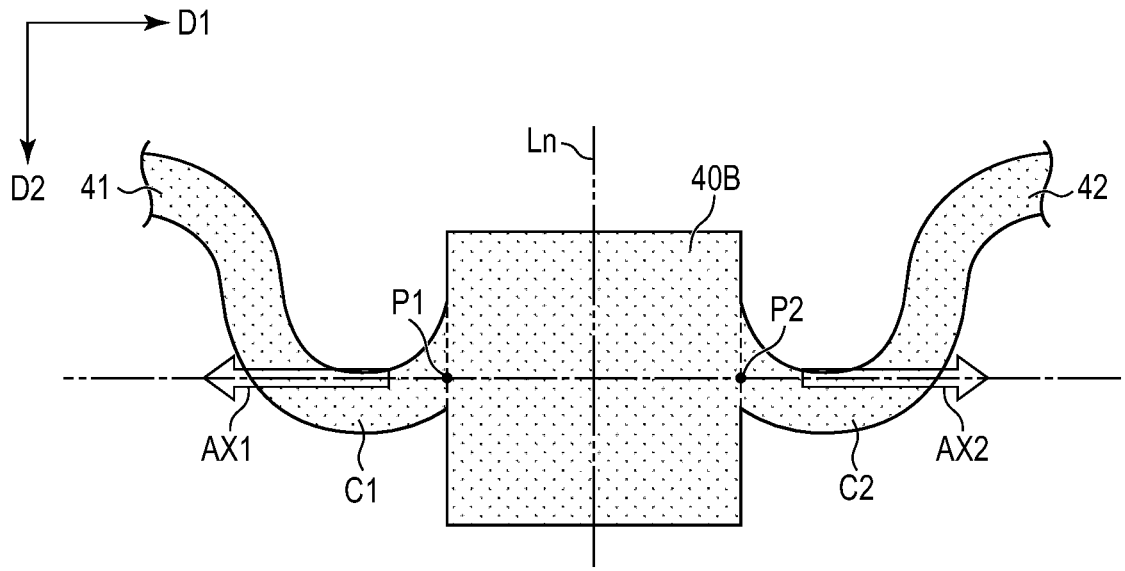
FIG. 9 is a plan view illustrating another configuration example.

FIG. 9 is a plan view illustrating another configuration example. The configuration example illustrated in FIG. 9 is different from the configuration example illustrated in FIG. 5 in that each of the first portion 41 and the second portion 42 does not include a straight portion (alternatively, the width W of the straight portion is larger than the length L of the straight portion (W>L)). The island-shaped portion 40B is formed in a substantially quadrangular shape, but may be formed in a substantially circular shape.

The first portion 41 and the second portion 42 are formed to be stretchable along the first direction D1, similarly to the configuration example illustrated in FIG. 5. There is a line symmetry relationship with respect to a perpendicular bisector Ln between a connection position P1 between the first portion 41 and the island-shaped portion 40B and a connection position P2 between the second portion 42 and the island-shaped portion 40B. The first portion 41 extends along the extension axis AX1 when a stretching force is applied in a direction opposite to the arrow indicating the first direction D1. The second portion 42 extends along the extension axis AX2 when a stretching force is applied in the direction of the arrow indicating the first direction D1. These extension axes AX1 and AX2 are located on the same straight line. That is, the first portion 41 and the second portion 42 are stretchable on the same straight line. Therefore, when the first portion 41 and the second portion 42 extend, the rotational torque of the island-shaped portion 40B is suppressed.

As a result, in the first curved portion C1 and the second curved portion C2, the stress caused by the rotational torque is suppressed, which can suppress occurrence of cracks. Further, breakage of the scanning line 1 disposed over the first portion 41 and the second portion 42 can be suppressed.

Figure 10:
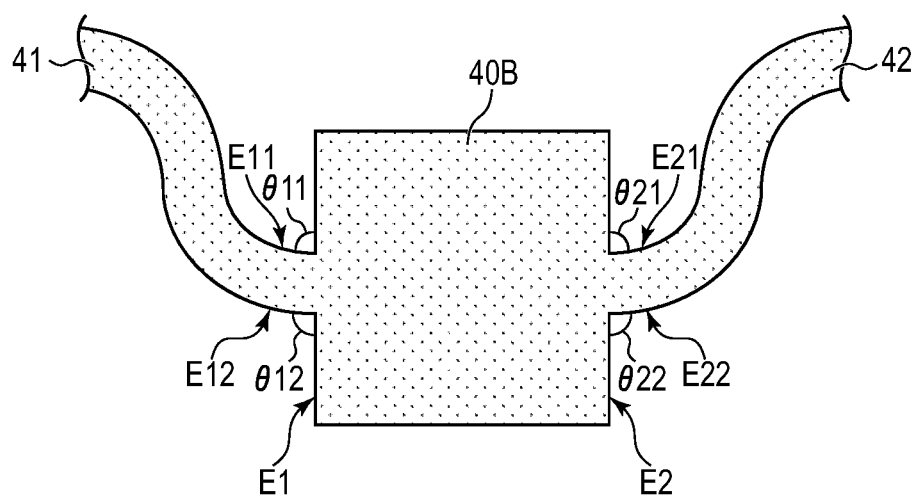
FIG. 10 is a plan view illustrating another configuration example.

FIG. 10 is a plan view illustrating another configuration example. In the configuration example illustrated in FIG. 10, similarly to the configuration example illustrated in FIG. 9, each of the first portion 41 and the second portion 42 does not have a straight portion.

The angle $\theta 11$ formed by the side E1 of the island-shaped portion 40B and the first side edge E11 of the first portion 41 is substantially equal to the angle $\theta 12$ formed by the side E1 and the second side edge E12. The angle $\theta 21$ formed by the side E2 of the island-shaped portion 40B and the third side edge E21 of the second portion 42 is substantially equal to the angle $\theta 22$ formed by the side E2 and the fourth side edge E22. Even in such a configuration example, when the first portion 41 and the second portion 42 extend, the rotational torque of the island-shaped portion 40B is suppressed, so that the same effect as that of the configuration example illustrated in FIG. 9 can be obtained.

Figure 11:
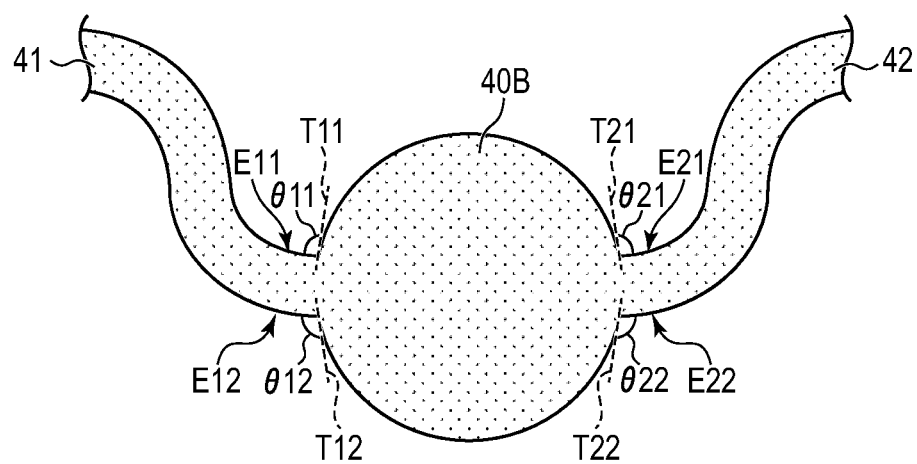
FIG. 11 is a plan view illustrating another configuration example.

FIG. 11 is a plan view illustrating another configuration example. The configuration example illustrated in FIG. 11 is different from the configuration example illustrated in FIG. 10 in that the island-shaped portion 40B is formed in a circular shape.

In such a configuration example, an angle formed by the island-shaped portion 40B and the first portion 41 and an angle formed by the island-shaped portion 40B and the second portion 42 are defined as follows. That is, tangents T11 and T12 are indicated by broken lines at connection points between each of the first side edge E11 and the second side edge E12 of the first portion 41 and the island-shaped portion 40B. An angle $\theta 11$ formed by the tangent T11 and the first side edge E11 is substantially equal to an angle $\theta 12$ formed by the tangent T12 and the second side edge E12. Similarly, an angle $\theta 21$ formed by the tangent T21 and the third side edge E21 is substantially equal to an angle $\theta 22$ formed by the tangent T22 and the fourth side edge E22. Even in such a configuration example, when the first portion 41 and the second portion 42 extend, the rotational torque of the island-shaped portion 40B is suppressed, so that the same effect as that of the configuration example illustrated in FIG. 9 can be obtained.

As described above, according to the present embodiment, it is possible to provide a flexible substrate capable of suppressing occurrence of cracks.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A flexible substrate comprising: an insulating base material comprising an island-shaped portion, a first portion having a band shape and connected to the island-shaped portion, and a second portion having a band shape and connected to the island-shaped portion; and a wiring layer provided on the insulating base material, wherein the first portion comprises a first curved portion and a first straight portion connecting the island-shaped portion and the first curved portion, and the second portion comprises a second curved portion and a second straight portion connecting the island-shaped portion and the second curved portion, wherein the first straight portion has a first side edge and a second side edge opposite to the first side edge, an angle formed by the island-shaped portion and the first side edge is substantially equal to an angle formed by the island-shaped portion and the second side edge, the second straight portion has a third side edge and a fourth side edge opposite to the third side edge, and an angle formed by the island-shaped portion and the third side edge is substantially equal to an angle formed by the island-shaped portion and the fourth side edge.

2. The flexible substrate according to claim 1, wherein the first straight portion extends in a first direction, and
a length of the first straight portion along the first direction is equal to or longer than a width of the first straight portion along a second direction intersecting the first direction.

3. The flexible substrate according to claim 2, wherein the second straight portion extends in the first direction, and
a length of the second straight portion along the first direction is equal to or longer than a width of the second straight portion along the second direction.

4. The flexible substrate according to claim 3, wherein a connection position between the first straight portion and the island-shaped portion is provided at a position facing a connection position between the second straight portion and the island-shaped portion with the island-shaped portion as a center, and
the first straight portion and the second straight portion extend on a same straight line.

5. The flexible substrate according to claim 3, wherein the island-shaped portion is formed in a substantially quadrangular shape, and
the first straight portion and the second straight portion are respectively connected to a pair of opposing sides of the island-shaped portion, and are positioned on a same straight line.

6. The flexible substrate according to claim 1, wherein the wiring layer has a first wiring portion provided in the first portion and a second wiring portion provided in the second portion, and
the first wiring portion and the second wiring portion are electrically connected each other.

7. The flexible substrate according to claim 6, further comprising an electrical element provided in the island-shaped portion, wherein the wiring layer further has a third wiring portion overlapping the electrical element, and
the first wiring portion and the second wiring portion are electrically connected via the third wiring portion.

8. A flexible substrate comprising: an insulating base material comprising an island-shaped portion, a first portion having a band shape and connected to the island-shaped portion, and a second portion having a band shape and connected to the island-shaped portion; and a wiring layer provided on the insulating base material, wherein the first portion and the second portion are formed to be stretchable on a same straight line, wherein the island-shaped portion is formed in a substantially quadrangular shape, and the first portion and the second portion are respectively connected to a pair of opposing sides of the island-shaped portion.

9. The flexible substrate according to claim 8, wherein the island-shaped portion is formed in a substantially circular shape.

10. The flexible substrate according to claim 8, wherein the first portion and the second portion are disposed point-symmetrically with respect to a center of the island-shaped portion.

11. A flexible substrate comprising:
an insulating base material comprising an island-shaped portion, a first portion having a band shape and connected to the island-shaped portion, and a second portion having a band shape and connected to the island-shaped portion; and
a wiring layer provided on the insulating base material, wherein
the first portion has a first side edge and a second side edge opposite to the first side edge,
the second portion has a third side edge and a fourth side edge opposite to the third side edge,
an angle formed by the island-shaped portion and the first side edge is substantially equal to an angle formed by the island-shaped portion and the second side edge, and
an angle formed by the island-shaped portion and the third side edge is substantially equal to an angle formed by the island-shaped portion and the fourth side edge.

12. The flexible substrate according to claim 11, wherein the island-shaped portion is formed in a substantially quadrangular shape, and
the first portion and the second portion are respectively connected to a pair of opposing sides of the island-shaped portion, and are formed to be stretchable on a same straight line.

13. The flexible substrate according to claim 11, wherein the island-shaped portion is formed in a substantially circular shape and is formed to be stretchable on a same straight line.

* * * * *